US006861669B2

(12) United States Patent
Tan et al.

(10) Patent No.: US 6,861,669 B2
(45) Date of Patent: Mar. 1, 2005

(54) COMPOUND DISPLAY

(75) Inventors: Boon Chun Tan, Penang (MY); Justin Lim Hwa Aik, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 63 days.

(21) Appl. No.: 10/404,218

(22) Filed: Mar. 31, 2003

(65) Prior Publication Data

US 2004/0188671 A1 Sep. 30, 2004

(Under 37 CFR 1.47)

(51) Int. Cl.[7] .............................................. H01L 29/04
(52) U.S. Cl. ............................. 257/59; 257/40; 257/57; 257/72; 257/291; 257/347; 257/351; 257/368
(58) Field of Search .............................. 257/40, 57, 59, 257/72, 291, 347, 351, 368

(56) References Cited

U.S. PATENT DOCUMENTS 6,445,005 B1 * 9/2002 Yamazaki et al. ............ 257/72

6,756,641 B2 * 6/2004 Lu ............................. 257/350

* cited by examiner

Primary Examiner—Long Pham
Assistant Examiner—Wai-Sing Louie

(57) ABSTRACT

A compound display for presenting images to a viewer is disclosed. The compound display includes first and second displays positioned such that the first display is viewable through the second display when the second display is not generating an image. The first display displays a first image. The second display includes an OLED having a first state in which the OLED generates light of a first intensity and a second state in which the OLED does not generate light. The OLED is transparent to light from the first display when the OLED is not generating light. The second display is positioned between the first display and the viewer. In one embodiment, the first display includes an array of inorganic LEDs that generate light of a greater intensity than that generated by said OLED in said first state.

7 Claims, 5 Drawing Sheets

COMPOUND DISPLAY

FIELD OF THE INVENTION

The present invention relates to LED displays.

BACKGROUND OF THE INVENTION

Displays based on light emitting diodes (LEDs) can be divided into two types. The first class of display utilizes pixels constructed from inorganic LEDs. Inorganic LEDs based on Group III–V materials are well known in the art. The second class of display is based on organic LEDs (OLEDs). Each class of display has strengths and weaknesses.

Inorganic LED displays are more robust, more reliable, and have higher brightness than OLEDs. However, displays based on inorganic LED developed using Group III–V materials have higher costs and lower resolution than displays based on OLEDs. Hence, inorganic LED displays have been limited to applications in which reliability or distance viewing is critical.

In contrast, OLEDs are relatively cheap to produce and provide higher resolution than displays based on inorganic LEDs. Unfortunately, OLEDs cannot produce the same level of light output without sacrificing device reliability and lifetime.

SUMMARY OF THE INVENTION

The present invention includes a compound display for presenting images to a viewer thereof. The compound display includes first and second displays positioned such that the first display is viewable through the second display when the second display is not generating an image. The first display displays a first image. The second display includes an OLED having a first state in which the OLED generates light of a first intensity and a second state in which the OLED does not generate light. The OLED is transparent to light from the first display when the OLED is not generating light. The second display is positioned between the first display and the viewer. In one embodiment, the first display includes an array of inorganic LEDs that generate light of a greater intensity than that generated by said OLED in said first state. The second display includes an array of OLEDs, the above-described OLED being part of this array. In another embodiment, the first display displays a second image, the second image having a light intensity less than or equal to the first intensity. In another embodiment, the first display includes a transparency and a light source for illuminating the transparency. The compound display is preferably operated in a mode in which the first display generates the first image and the OLED in the second display is set to the second state followed by a mode in which the OLED in the second display is set to the first state. In one embodiment, the generation of the first image is discontinued when the second display is in the first state.

DETAILED DESCRIPTION OF THE PREFERRED EMBODIMENTS OF THE INVENTION

The present invention combines the strengths of both the OLED and LED displays in a single display by superimposing an OLED display over a LED display. Both displays function independently; hence, the LED display can be driven to very high brightness to convey information for further distance viewing while achieving good reliability. On the other hand, the OLED device can be turned on for near viewing where higher resolution is often more important than high intensity light output.

Figure 1:
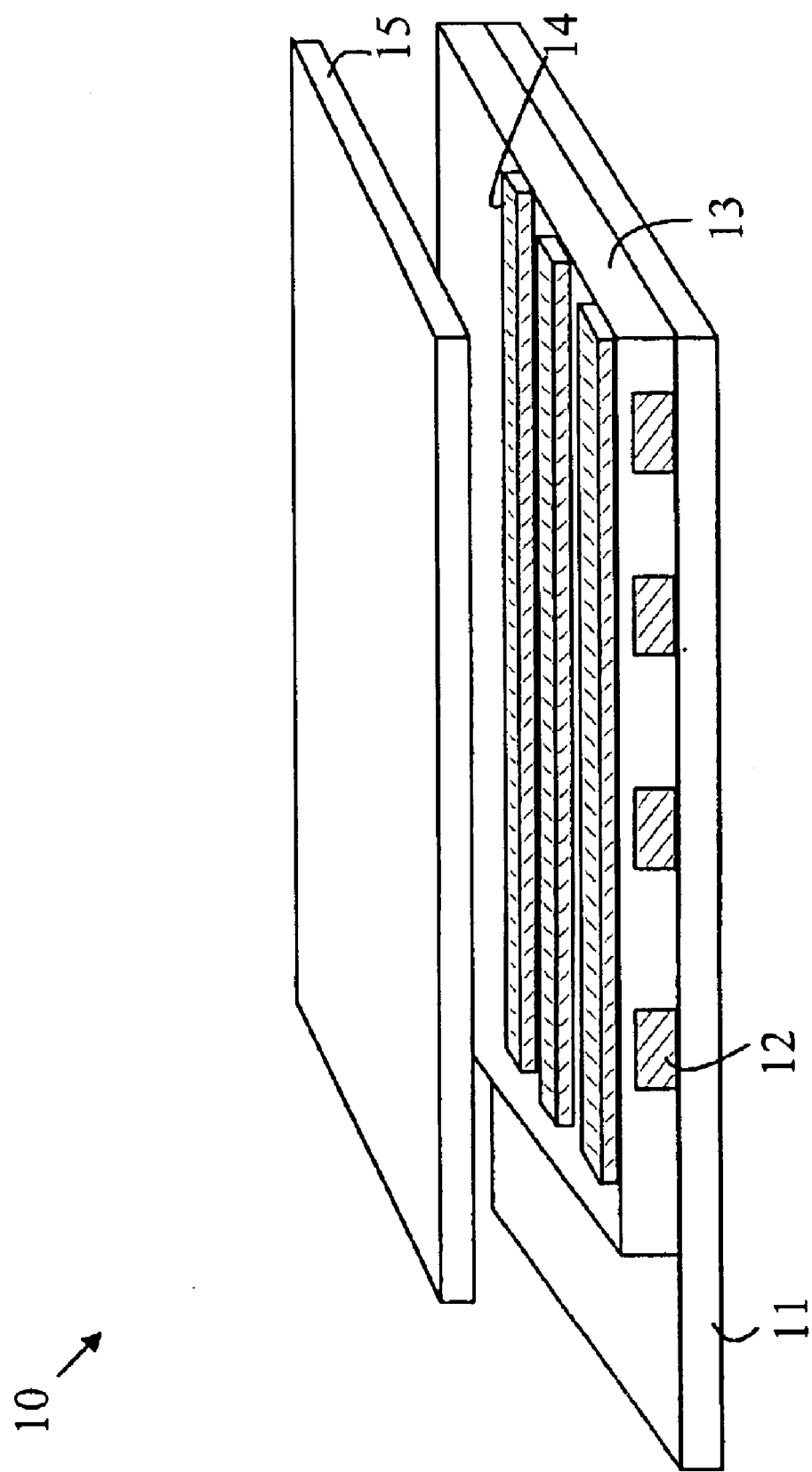
FIG. 1 illustrates a typical OLED display 10.

The manner in which the present invention provides its advantages can be more easily understood with reference to FIG. 1, which illustrates a typical OLED display 10. Since such OLED displays are known to the art, the construction of the display will not be discussed in detail here. For the purposes of the present discussion, it is sufficient to note that OLED display 10 generates light at a location determined by the intersection of an anode trace and a cathode trace. The anode traces are typically constructed from ITO strips 12 that are transparent. In the typical OLED display, light generated in the device exits through the anode traces. The cathode traces are constructed from strips 14 of a suitable low work function material such as Ca, Mg, Li, Al, or alloys of the foregoing. An organic electroluminescent layer 13 is deposited between the anode and cathode trace layers. This layer generates light when a current flows through the material. While the electroluminescent layer is shown as a single layer, it should be noted that the electroluminescent layer may include a number of sub-layers in addition to a layer of electroluminescent material. For example, electroluminescent layers consisting of a layer of electroluminescent material sandwiched between a layer of a hole injection material and a layer of an electron injection material are known to the art. The anode traces are typically deposited on a glass substrate 11. To protect the cathode layers from moisture and oxygen, a back cover 15 is used to cover the cathode traces. The back cover 15 and glass substrate 11 are typically bonded to one another around the edges of the device to prevent oxygen and moisture from entering the display from the sides.

The present invention makes use of the observation that the cathode layers can be made transparent by limiting the thickness of these layers. Hence, an OLED that is transparent to light can be constructed by utilizing a thin cathode layer. For example, a 60-angstrom thick layer of Ca transmits more than 80 percent of the light that strikes the layer.

Figure 2:
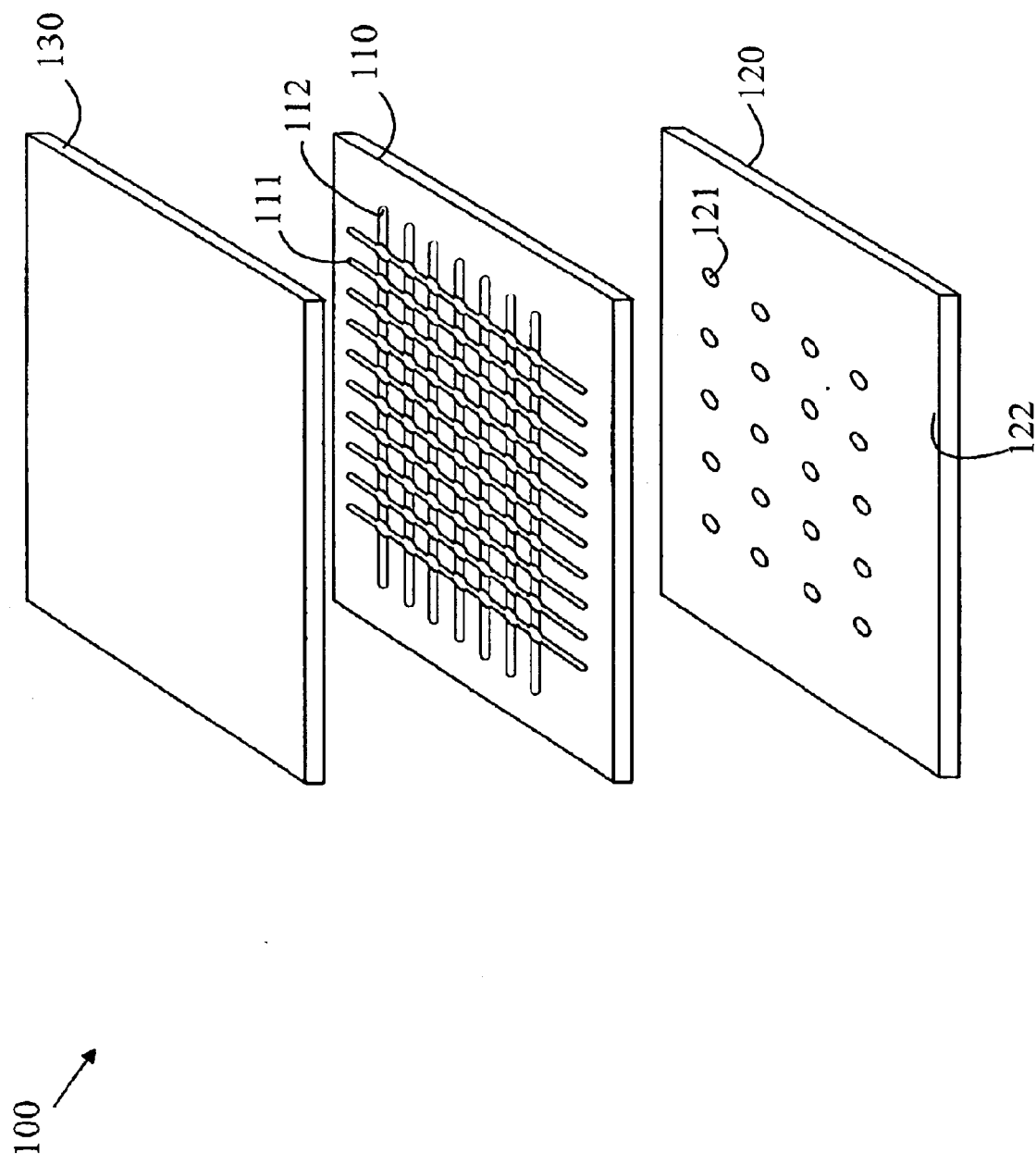
FIG. 2 is an exploded perspective view of a compound display 100 according to one embodiment of the present invention.

Refer now to FIG. 2, which is an exploded perspective view of a compound display 100 according to one embodiment of the present invention. Compound display 100 includes an OLED display 110 having a design similar to that described above and a LED display 120. LED display 120 is conventional in design, and hence, will not be discussed in detail here. For the purposes of the present discussion, it is sufficient to note that in this embodiment of the present invention, LED display 120 is constructed from a plurality of LEDs 121 that are arranged on a substrate 122. LED display 120 also includes any driving circuitry needed to address and drive the individual LEDs. To simplify the drawings, the driving circuitry used in both the OLED and inorganic LED arrays has been omitted from the drawings.

In one preferred embodiment of the present invention, OLED display 110 has a substantially higher resolution, i.e., pixels per cm$^2$, than LED display 120. However, each of the LEDs in LED display 120 has a substantially higher light output than a pixel in OLED 110.

OLED display 110 has anode and cathode traces 111 and 112, respectively, that are transparent to the light generated by the LEDs in LED display 120. Hence, when OLED display 110 is off, and LED display 120 is on, a viewer sees the light pattern generated by LED display 120. When the user moves closer to the display and triggers the device that controls the compound display, LED display 120 can be turned off and OLED display 110 turned on to provide the viewer with a high resolution image that has sufficient intensity to be viewed from the closer location.

The above-described embodiments of the present invention assume that the cathode electrodes in the OLED display are sufficiently transparent to allow the light from the underlying LED display to be transmitted without introducing any substantial artifacts to the pixels of the underlying LED display. If the cathode traces of the OLED display absorb a significant amount of light, the cathode traces can introduce artifacts into the image being generated by the underlying LED display if these traces overlie the pixels of the underlying LED display. This situation can be avoided by positioning the LEDs of the underlying LED display such that the cathode traces of the OLED display do not overlie the LED display pixels.

Figure 3:
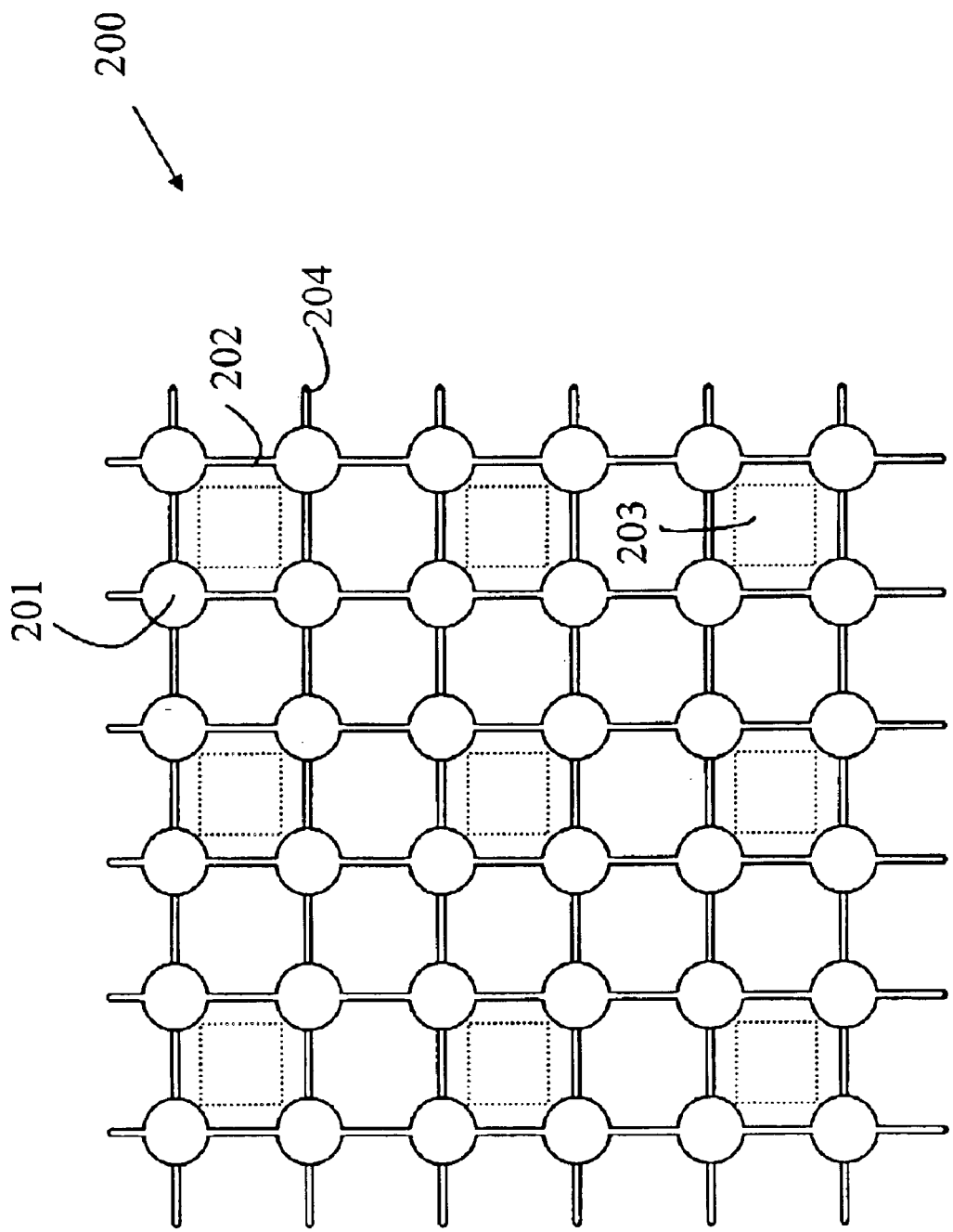
FIG. 3 is a top view of a portion of another embodiment of a display according to the present invention.

Refer now to FIG. 3, which is a top view of a portion of another embodiment of a display according to the present invention. Display 200 is constructed from an OLED display that overlies a LED display as described above. The cathode metal layer defines pixels 201 in the OLED display. The cathode traces are thinned between the pixels of the OLED display as shown at 202. This leaves a large open area between the pixels of the OLED array. The pixels of the underlying LED display are positioned below selective ones of these open spaces. The pixels of the LED display are shown in phantom in the drawing. An exemplary pixel is labeled at 203.

In the embodiment shown in FIG. 3, the anode traces 204 are also shown as being thinned between the pixels of the OLED display. However, the thinning of these traces is not as critical, since the anode traces are typically constructed from ITO, and ITO has a much higher degree of transparency than the metals used for the cathode traces.

Refer again to FIG. 2. The inclusion of a circular polarizer 130 can enhance the contrast provided by the display by filtering ambient light that is reflected from the glass covers on the OLED. However, such a polarizer also reduces the overall brightness of both displays. The circular polarizer is not needed if the ambient lighting is low or the reflections of ambient light are minimal. For example, the polarizer is not needed when the display is 20 used in a dark environment, or when the display is placed behind a case that already incorporates an effective polarizer or filter.

The above-described embodiments of the present invention have assumed that the OLED display and inorganic LED display are operated such that only one display generates light at a time. However, embodiments in which both displays operate simultaneously can also be practiced without departing from the teachings of the present invention. In such an arrangement, the OLED display can provide different colors from those generated by the inorganic LED display, and hence, the viewer will see different color patterns when an OLED display pixel that overlies an inorganic LED pixel is turned on simultaneously with the inorganic LED pixel.

Figure 4:
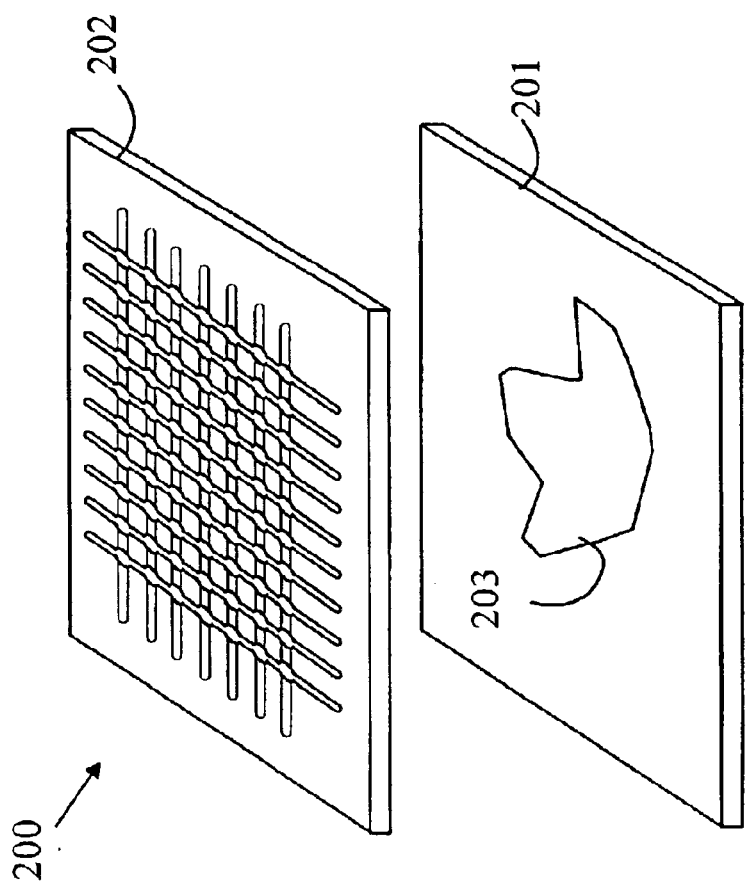
FIG. 4 illustrates a more general embodiment of a display 200 according to the present invention.

While the above-described embodiments of the present invention have utilized an inorganic display that is organized as an array of pixels for the high intensity display, other forms of high intensity display can also be utilized. Refer now to FIG. 4, which illustrates a more general embodiment of a display 200 according to the present invention. Display 200 has a near field display mode and a far field display mode. In the far field display mode, display 200 generates a high-intensity image that can be viewed from locations that are far from the display. In the near field mode, display 200 generates a lower intensity image having a higher resolution than that generated in the far field display mode. The high-resolution image differs from the low-resolution image in that the high-resolution image includes at least one object that has dimensions that are less than the dimensions of the smallest object that is generated in the low-resolution image.

Display 200 includes a display 201 and a transparent OLED display 202 through which an image generated by display 201 is viewed. As noted above, the image generated by OLED display 202 can be turned on in combination with the image generated by display 201.

In one embodiment, display 201 generates light of a higher intensity than that generated by OLED display 202 as discussed above. Such an embodiment is useful in providing a limited high-intensity display for viewing by an observer who is far from the display to attract the observer to a location closer to the array where the OLED display is then utilized to provide a lower intensity but more detailed image or set of images. However, embodiments in which display 201 generates light having an intensity similar to that generated by OLED display 202 when the observer is in the near field can also be practiced. As noted above, both displays can be utilized simultaneously, and hence, the near field images can be a combination of those generated by each display.

Figure 5:
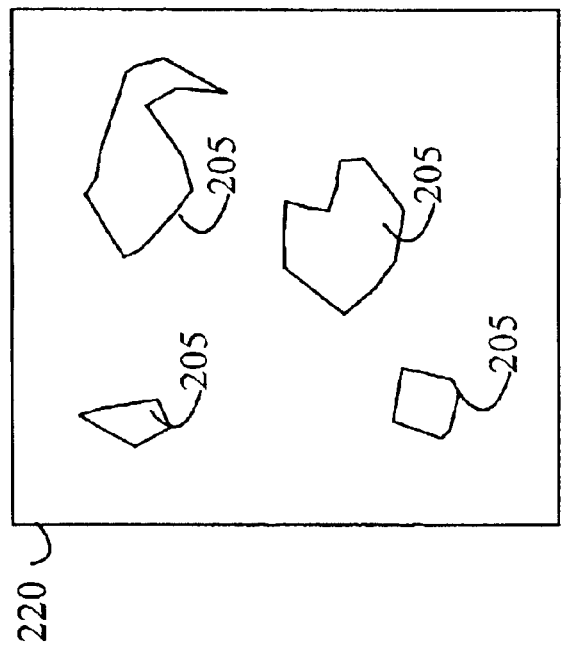
FIG. 5 is a top view of an exemplary display 220 that illustrates selected transparencies.

Display 201 can be any display that can generate an image 203 having a light intensity significantly greater than images generated by OLED display 201. The pixilated inorganic LED displays discussed above are examples of such a display. However, display 201 can also be constructed from other forms of displays such as a light source and a transparency that is illuminated by the light source when the light source is turned on. Refer now to FIG. 5, which is a top view of an exemplary display 220 of this type. Display 220 includes a plurality of light sources that illuminate different transparencies 205 when each light source is activated. To simplify the drawing, the individual light sources have been omitted from FIG. 5. Each of the transparencies provides an image of an "object" that is seen through transparent OLED display 201 shown in FIG. 4. It should be noted that the light sources used in display 220 can also have different intensity settings so that the images can be displayed as lower intensity background objects that are overlaid by the images generated by the OLED display when the display 200 is operating in the near field mode.

Figure 6:
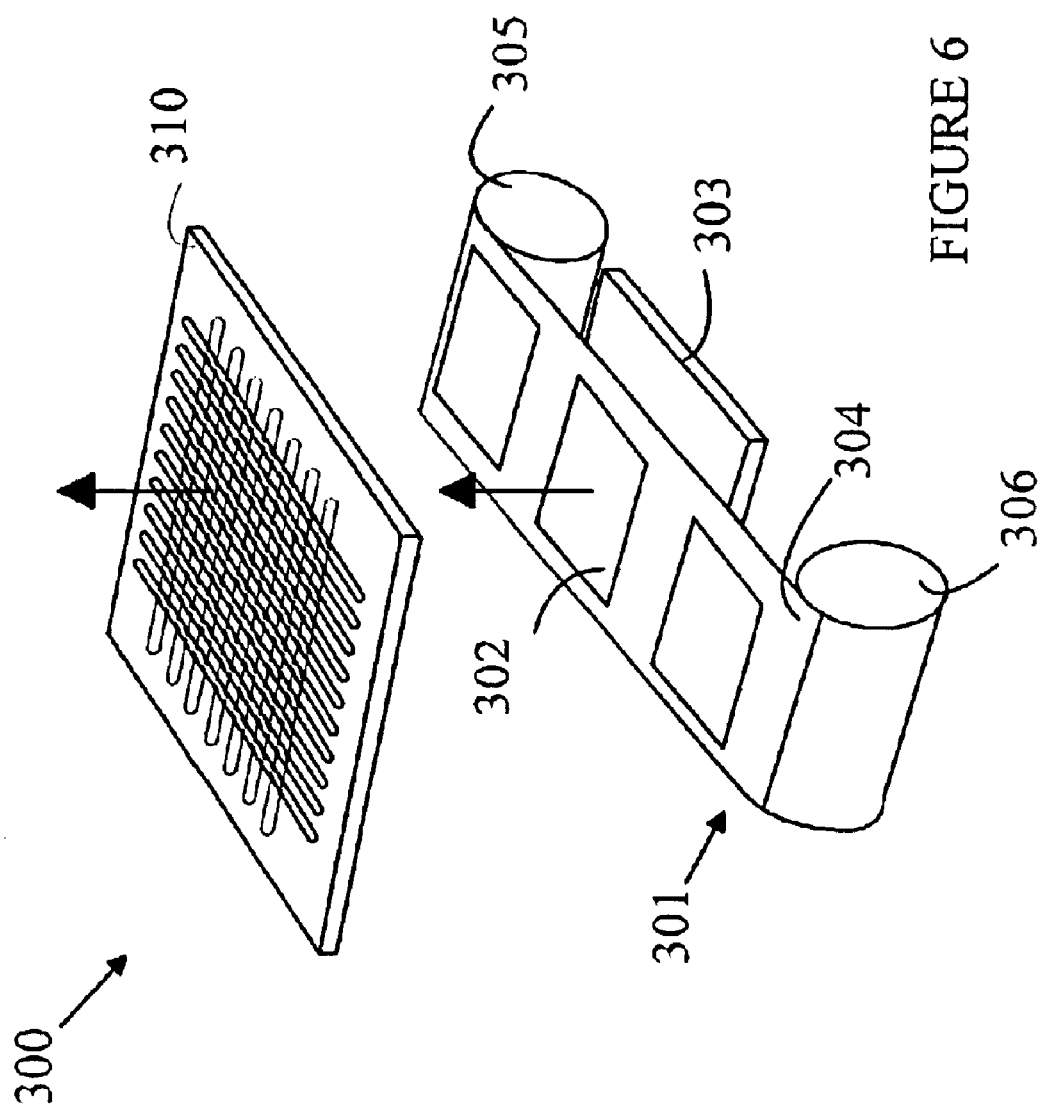
FIG. 6 illustrates a system having a background display that can display any of a plurality of background images.

The embodiments discussed above with respect to the background display being constructed from a transparency and a light source can be extended to provide a large number of background displays by including a mechanism for changing the transparency that is being illuminated. Refer now to FIG. 6, which illustrates a system having a background display that can display any of a plurality of background images. Display 300 includes an OLED display 310 that is analogous to the OLED displays discussed above, and hence, will not be discussed in detail here. Display 300 also includes a background projector 301 that displays images stored on a roll of transparencies 304. One of the transparency images 302 is positioned over a light source 303 that projects the transparency image through the OLED display panel. The specific background transparency is positioned by winding and unwinding the roll between rollers 305 and 306. The projection lens used by projector 301 has been omitted from the drawing to simplify the drawing.

While display 201 has been described in terms of transparencies and light sources, this type of display can be constructed using inorganic LEDs that are shaped to form the images in question or components of such images that are greater than the single pixel LEDs described above. Since the intensity of light generated by the LED can be controlled by controlling the current through the LED, such a display can provide multiple intensity images as well.

Similarly, the OLED displays discussed above can be organized as a regular array of identically shaped pixels or as larger pixels in which the pixels have individual shapes determined by the shape of a finite set of objects that are to be displayed. In addition, both the inorganic display and OLED display can include regions that are organized as a regular array of pixels and other regions that display larger predetermined objects.

Various modifications to the present invention will become apparent to those skilled in the art from the foregoing description and accompanying drawings. Accordingly, the present invention is to be limited solely by the scope of the following claims.

What is claimed is:

1. A compound display for presenting images to a viewer thereof, said compound display comprising:

a first display for displaying a first image; and a second display comprising an OLED having a first state in which said OLED generates light of a first intensity and a second state in which said OLED does not generate light, said OLED being transparent to light from said first display when said OLED is not generating light, said second display being positioned between said first display and said viewer.

2. The compound display of claim 1 wherein said first display comprises an array of inorganic LEDs.

3. The compound display of claim 1 further comprising a circular polarizer between said second display and said viewer.

4. The compound display of claim 1 wherein said first display emits light having a greater intensity than said OLED.

5. The compound display of claim 1 wherein said second display comprises an array of OLEDs.

6. The compound display of claim 1 wherein said first display displays a second image, said second image having a light intensity less than or equal to said first intensity.

7. The compound display of claim 1 wherein said first display comprises a transparency and a light source for illuminating said transparency.

* * * * *